United States Patent
Lyons et al.

(10) Patent No.: US 6,649,211 B2
(45) Date of Patent: Nov. 18, 2003

(54) SELECTIVE DEPOSITION OF HYDROUS RUTHENIUM OXIDE THIN FILMS

(75) Inventors: Karen Swider Lyons, Arlington, VA (US); Debra Rose Rolison, Arlington, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 58 days.

(21) Appl. No.: 10/084,319

(22) Filed: Feb. 28, 2002

(65) Prior Publication Data

US 2003/0161948 A1 Aug. 28, 2003

(51) Int. Cl.$^7$ .............................. B05D 5/12; C23C 16/40
(52) U.S. Cl. .............................. 427/126.5; 427/255.31; 427/255.7; 427/307
(58) Field of Search ............................ 427/307, 255.31, 427/255.7, 126.5

(56) References Cited

U.S. PATENT DOCUMENTS

| | | | |
|---|---|---|---|
| 4,289,591 A | | 9/1981 | Davidson et al. |
| 5,314,727 A | | 5/1994 | McCormick et al. |
| 5,372,849 A | | 12/1994 | McCormick et al. |
| 5,621,609 A | * | 4/1997 | Zheng et al. ................ 361/503 |
| 5,684,619 A | | 11/1997 | Shabrang et al. |
| 5,739,049 A | | 4/1998 | Park et al. |
| 5,851,506 A | * | 12/1998 | Zheng et al. ............. 423/592.1 |
| 6,440,495 B1 | * | 8/2002 | Wade et al. ................. 427/250 |
| 6,479,100 B2 | * | 11/2002 | Jin et al. ................ 427/255.31 |
| 6,508,959 B1 | * | 1/2003 | Li et al. ....................... 252/514 |

OTHER PUBLICATIONS

Sankar et al, Low temperature chemical vapour deposition of ruthenium and ruthenium dioxide on polymer surfaces, J. Mat. Chem., Vol 9, 1999, pp. 2439–2444.

Li et al, Lamellar structure of POM spherulites imaged by a two–stage RuO4 staining technique, J. Applied Polymer Science, Vol 59, 1733–1740 (1996).

Jia et al, Heteroepitaxial growth of highly conductive metal oxide RuO2 thin films by pulsed laser deposition, Appl. Phys. Lett., vol. 67, No. 12, Sep. 18, 1995, pp. 1677–1679.

Yuan, Low–temperature Chemical Vapor Deposition of Ruthenium Dioxide from ruthenium tetroxide: A simple approach to high–purity RuO2 Films, Chem. Mater., 1993, 5, pp. 908–910.

Morea et al, Surface Characterization of the Active RuO2 x H2O Catalyst Supported on Teflon, J. Chem. Soc. Faraday Trans. 1, 1989, 85, (11) pp. 3861–3870.

Montezinos et al. The Use of Ruthenium in Hypochlorite as a Stain for Polymeric Materials, J. Polymer Science, vol. 23, (1985), pp. 421–425.

(List continued on next page.)

*Primary Examiner*—Bret Chen
(74) *Attorney, Agent, or Firm*—John Gladstone Mills, III; John Karasek

(57) ABSTRACT

A method for selectively depositing a film of hydrous ruthenium oxide on a substrate, the method comprising the steps of:

selectively functionalizing a substrate surface;

preparing an oxidizing aqueous solution of a Ru-containing composition;

generating $RuO_4(g)$ from said oxidizing solution;

selectively depositing a film of hydrous ruthenium oxide from said vapor of said oxidizing solution on said functionalized surface of said substrate; and depositing by autocatalysis hydrous ruthenium oxide from said vapor of said oxidizing solution on said previously deposited hydrous ruthenium oxide. $RuO_2 \cdot xH_2O$ films are uniformly deposited on substrates that have been selectively surface-modified with or already contain the $RuO_4$-reactive functional groups.

13 Claims, 4 Drawing Sheets

OTHER PUBLICATIONS

Sakurai, et al, Adsorption of Ruthenium Tetroxide on Metal Surfaces, J. Phys. Chem., 1985, 89, pp. 1892–1896.

Trent et al, Ruthenium Tetraoxide Staining of Polymers for Electron Microscopy, Macromolecules, 1983, 16, pp. 589–598.

Trent et al, Electron Microscopy of Ps/PMMA and Rubber–Modified Polymer Blends: Use of Ruthenium Tetroxide as a New Staining Agent, J. Polymer Science, vol. 19, 1981, pp. 315–319.

Vitali et al, Ruthenium Tetroxide as a Staining Agent for Unsaturated and Saturated Polymers, Polymer, Vol 21, 1980, pp. 1220–1222.

Gaylarde et al, Ruthenium Tetoxide for Fixing and Staining Cytoplasmic Membranes, Science, vol. 161, 1968, pp. 1157–1158.

* cited by examiner

| HIGHLY REACTIVE | PARTIALLY REACTIVE | NON-REACTIVE |
|---|---|---|
| ALCOHOLS | | HYDROCARBONS |
| THIOLS | | CARBON |
| AMINE/AMIDES | | CARBOXYLIC ACIDS |
| CLEAN METAL SURFACES | | NITRO GROUPS |
| | | SULFONIC GROUPS |
| SURFACES | | METAL OXIDE |
| COMPOUNDS | | INORGANIC |
| CATECHOL | AMINOANTHRAQUINONE, 2- | ADIPIC ACID |
| DEXTROSE | ANTHRAQUINONE | BENZOIC ACID |
| DIMETHYLGLYOXIME | M-BENZENEDISULFONIC | BOROSILICATE GLASS |
| DITHIOOXALATE, K SALT | ACID, Na SALT | CARBON |
| 1, 12-DODECANEDIOL | BIPYRIDINE | 1, 4-DINITROBENZENE |
| GOLD (etched) | CITRIC ACID | OXALIC ACID |
| KAPTON® (polyimide) | SODIUM CITRATE | OXALIC ACID, K SALT |
| 2-MERCAPTOBENZOTHIAZOLE, | P-DIMETHOXYBENZENE | PARAFFIN (unstretched) |
| NAPTHYLACRYLAMIDE | DITHIZONE | NAFION® |
| 2-NPTHYLOXY ACETIC ACID | GELATIN | QUARTZ |
| PARAFFIN (stretched) | GLYCOLIC ACID | SILICON |
| PHENOL | POLYSTYRENE | SILOXANE |
| RESORCINOL | STARCH | |
| SULFANILIC ACID | SULFANILIC ACID | |
| TARTARIC ACID | UREA | |
| TEREPHTHALIDICARBOXALDEHYDE | | |
| TITANIUM (etched) | | |
| TITANIUM NITRIDE | | |

*FIG. 1*

VOLTAGE - pH DIAGRAM FOR THE
Ru - H2O SYSTEM AT 25°C

| SAMPLE HEAT TREATMENT | x MOLE % $H_2O$ | PSEUDOCAPACITANCE (F/g) ± 10% |
| --- | --- | --- |
| 25°C | 2.3 | 505 |
| 100°C | 0.84 | 740 |
| 150°C | 0.58 | 850 |
| 169°C | 0.48 | 735 |
| 200°C | .35 | 365 |
| 300°C | .14 | 250 |
| 400°C | 0.02 | 125 |

*FIG. 4*

SELECTIVE DEPOSITION OF HYDROUS RUTHENIUM OXIDE THIN FILMS

BACKGROUND OF THE INVENTION

1. Field of the Invention

The present invention relates generally to a selective deposition of hydrous ruthenium oxide ($RuO_2$ or $RuO_2 \cdot xH_2O$ and/or $RuO_xH_y$) thin films. More particularly, the invention relates to the selective deposition of hydrous ruthenium oxide thin films by chemical vapor deposition (CVD) on selected or modified substrates. The hydrous ruthenium oxide films made by the method of the invention will be useful for catalytic and electronic applications.

2. Description of the Related Art $RuO_2$ is found in both anhydrous and hydrous forms. The anhydrous form of $RuO_2$ exhibits the electrical properties of a metal. It is used as a thick film resistor and as an electrode material in capacitors because of its metallic conductivity and corrosion resistance. Anhydrous $RuO_2$ thin films are also used as barrier coatings for some electronic applications, and in catalysis.

The hydrous form of $RuO_2$ is written as $RuO_2 \cdot xH_2O$, $RuO_2$, and/or $RuO_xH_y$. Hydrous ruthenium oxide can contain from 0.03 to 3 moles of structural $H_2O$ per mole of $RuO_2$. The structural water in $RuO_2$ can be changed by heating the material between 25 and 400° C., see FIG. 4. Like the anhydrous form of $RuO_2$, hydrous ruthenium oxide is a metallic conductor, and in addition, it also conducts protons. Hydrous ruthenium oxide has pseudocapacitive behavior. It is used as a charge-storage medium in ultracapacitors. Charge storage of hydrous ruthenium oxide is optimized when it is heated between 130 and 170° C. and has the approximate formula $RuO_2 \cdot 0.5H_2O$. The hydrous form of ruthenium oxide also has numerous applications in catalysis and electrocatalysis. When combined with platinum, hydrous ruthenium oxide is an excellent electrocatalyst for methanol oxidation and is therefore useful for direct methanol fuel cells. Thin films of hydrous ruthenium oxide are often deposited on Ti and/or $TiO_2$ to make the dimensionally stable electrodes used for brine electrolysis by the chlor-alkali industry. Hydrous ruthenium oxide is used for water oxidation when combined with a strong oxidant, e.g., $Ce^{4+}$, $Ru(bpy)_3^{3+}$.

The deposition of hydrous and anhydrous ruthenium oxide thin films has been the subject of numerous publications and patents. Anhydrous thin films are typically deposited via CVD processes or physical methods, such as pulsed laser deposition. The hydrated forms of the films are deposited from aqueous solutions, usually using $RuCl_3$ precursors. Most of the available processes must be carried out at elevated temperatures, i.e., >300° C., in order to complete the decomposition of the Ru precursors.

Previous research has shown that $RuO_4$ is a precursor for the deposition of solid ruthenium oxide. For instance, the $RuO_4$ that forms during nuclear fission processes volatilizes to $RuO_4(g)$ and deposits as a ruthenium oxide on the stainless-steel surfaces of the nuclear fuel reprocessing and water treatment equipment. Solid $RuO_4$ has been used as a precursor to deposit ruthenium oxide films on polymers substrates at temperatures above 150° C.

$RuO_4(g)$ is generated by dissolving solid $RuO_4$ in water or by adding a strong oxidizer (e.g., $NaOCl$, $KBrO_3$, $KMnO_4$, $Ce(SO_4)_2$, $NaIO_4$) to $RuO_2 \cdot xH_2O$ or $RuCl_3$ in water. Biological specimens are stained with these ruthenium oxide solutions for microscopy analysis.

Despite the prior art, there are no reports that disclose the use of $RuO_4(g)$ to selectively deposit a thin film of $RuO_2 \cdot xH_2O$ on a substrate.

OBJECTS OF THE INVENTION

Accordingly, one object of this invention is to provide a method for selectively depositing hydrous ruthenium oxide films on a substrate.

Another object of this invention is to provide a method of functionalizing a surface of a substrate in order to selectively deposit hydrous ruthenium oxide films at the selectively functionalized locations on the substrate surface.

A further object of this invention is to deposit a thin film of hydrous ruthenium oxide onto a substrate.

A still further object of this invention is to deposit a hydrous ruthenium oxide film under ambient or near ambient temperature and pressure conditions.

A further object of this invention is to deposit a hydrous ruthenium oxide film on a substrate at below 90° C.

Another object of this invention is to perform such deposition on a range of useful surfaces, including metal and polymer surfaces.

It is a further object of this invention to selectively deposit hydrous ruthenium oxide on a substrate followed by a subsequent metallization for catalyst formation.

It is a further object of the invention to control the degree of structural water content of the deposited $RuO_2$ by heating at selected temperatures up to 175° C.

It is a further object of this invention to perform such deposition on flexible substrates, and to have the deposited film have sufficient elasticity to retain conductivity even when slightly bent on flexible substrates.

SUMMARY OF THE INVENTION

These and other objects of this invention are achieved in a preferred method of the invention.

An aspect of the present invention is a method for selectively depositing a film of hydrous ruthenium oxide on a substrate, the method comprising the steps of: selectively functionalizing a substrate surface; preparing an oxidizing aqueous solution of a Ru-containing composition; generating $RuO_4(g)$ from the oxidizing solution; selectively depositing a film of hydrous ruthenium oxide from the vapor derived from the oxidizing solution on the functionalized surface of the substrate; and depositing by autocatalysis hydrous ruthenium oxide from the vapor of the oxidizing solution on the previously deposited hydrous ruthenium oxide.

Another aspect of the present invention is a method of selectively depositing a film of hydrous ruthenium oxide on a substrate, the method comprising the steps of: selectively functionalizing a substrate surface; preparing an oxidizing aqueous solution of a ruthenium-containing composition, wherein the oxidizing solution contains $RuO_2 \cdot xH_2$ and $Ce(SO_4) \cdot 2H_2SO_4$ or $RuCl_3 \cdot xH_2O$ and $Ca(OCl)_2$ in water; generating $RuO_4(g)$ from the oxidizing solution; selectively depositing a film of hydrous ruthenium oxide from the vapor of the oxidizing solution on the functionalize surface of the substrate; and depositing by autocatalysis hydrous ruthenium oxide from the vapor of the oxidizing solution on the previously deposited hydrous ruthenium oxide.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designated identical or corresponding parts throughout the several views, and wherein:

FIG. 1 is a table showing the reactivity of selected compounds with $RuO_4(g)$;

FIG. 4 is a table showing how the heat treatment of bulk hydrous ruthenium oxide powder affects the value of x (mole % of water) and the pseudocapacitance.

DETAILED DESCRIPTION OF THE PREFERRED EMBODIMENTS

Figure 2:
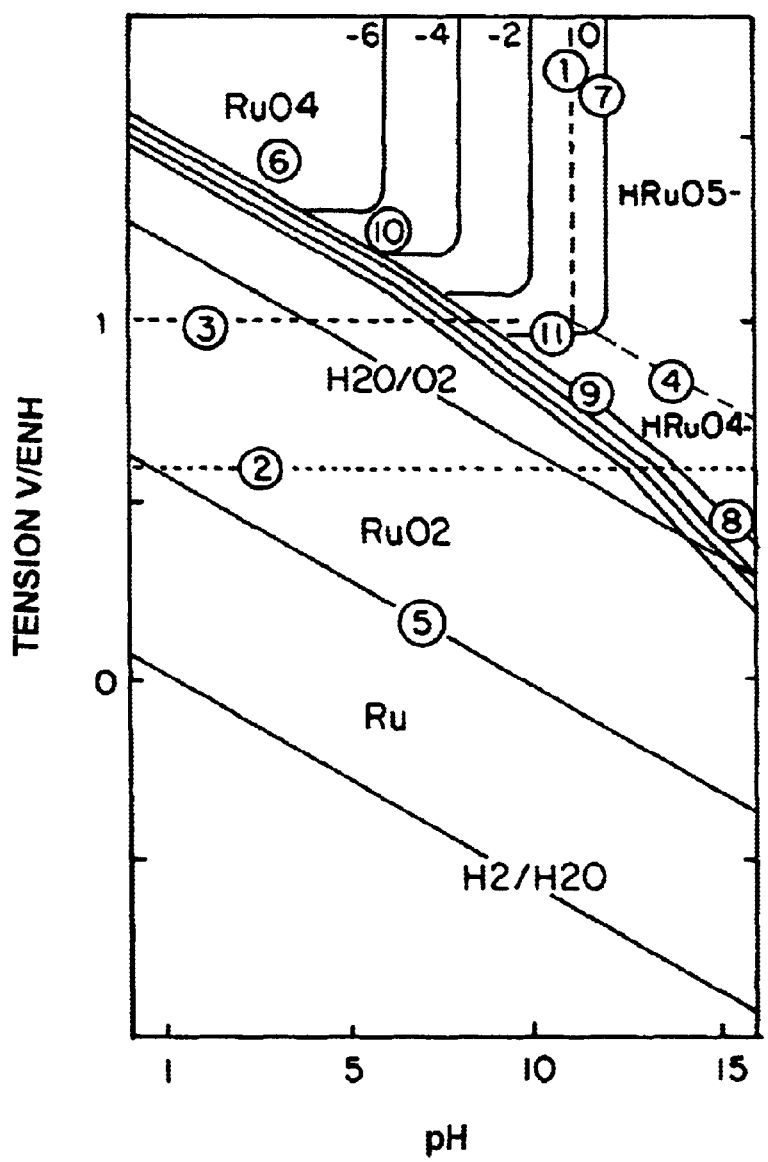
FIG. 2 illustrates a Pourbaix diagram for a $Ru—H_2O$ system at 25° C.

Referring now to the drawings, the method for fabrication a thin film of hydrous ruthenium oxide on a selected substrate or a selectively modified substrate involves the following operational steps:

The specific conditions required for the decomposition of $RuO_4(g)$ to ruthenium oxide have not been clearly identified in published literature. In research conducted by these inventors, it has been determined that $RuO_4(g)$ decomposes to $RuO_2.xH_2O$ when it comes in contact only with specific functional groups, such as alcohols (—C—OH), thiols (—SH), amines/amides (—NH,) and clean etched metal surfaces.

Non-reactive functional groups include hydrocarbons ($C_xH_y$), carbon, carboxylic acids (—COOH), nitro groups (—$NO_2$), sulfonic groups (—$SO_3$), and most metal oxides. It should be noted that several prior reports state incorrectly that $RuO_4$ reacts with saturated and unsaturated hydrocarbons to form $RuO_2$.

A wide range of substrates are useful for the present invention, including organic polymers and metals, or substrates with coatings of polymers or metals. Accordingly, in order for most substrates to be used in the present invention, their surfaces must be selectively modified. The substrates are found in two groups, an organic group and a metal group. Possible organic substrates are: polyphenol (BAKELITE®), graphite, carbon paper, perfluorsulfonic ionomer membranes (NAFION®), polyimide (KAPTON®) and paraffin. Possibly metal substrates include: titanium, gold, copper and indium foil or thin films.

Most substrates require cleaning plus additional surface modification to enable uniform deposition of hydrous ruthenium oxide. Chemical methods can be used to modify or prepare the surfaces of a metal, carbon, or polymer so that hydrous ruthenium oxide may be deposited. The entire surface of Ti is prepared by cleaning and etching in baths of ethanol, acetone and 5% HF. The etched substrate is then rinsed with water and dried under nitrogen. Gold surfaces are cleaned with ethanol and water, etched with oxygenated solution of KOH and KCN, rinsed with water and dried under nitrogen. Alternatively, the native oxide films on the Ti or Au can be physically removed in patterns using standard techniques such as ion milling. The metal surfaces may also be masked and then cleaned to create a desired pattern. The graphite sheet, carbon paper and polyphenol can be cleaned in methanol or ethanol, oxidized by soaking in 5% $H_2O_2$, and dried in nitrogen. NAFION® can functionalized by soaking in dilute 4-aminophenol in acetonitrile to provide an alcohol-terminated surface. The paraffin can be prepared by stretching. Thus, the surface of a selected substrate is selectively prepared to have a functional group (s) that will reduce the $RuO_4(g)$ to the hydrous ruthenium oxide. Polyimide strips on a silicon substrate will result in the selective deposition of the hydrous ruthenium oxide on the polyimide strips and not on the $SiO_2$-passivated silicon substrate. Specific functional groups, such as alcohols (—C—OH), thiols (—SH), amines/amides (—$NH_x$) and clean metals surfaces are selectively provided to a substrate thereby allowing for the selective deposition of hydrous ruthenium oxide on the substrate.

Since the method of the invention will not effectively deposit hydrous ruthenium oxide on glass substrates, as they are non-oxidizable, patterned deposition can be achieved by coating a glass substrate in a pattern with some other substrate material, such as an alcohol-terminated organic-containing compound or a suitable metal, that will provide a functional group that allows for the hydrous ruthenium oxide deposition. For instance, it has been demonstrated that when a hydrocarbon-based oil pattern is applied to a glass substrate and mounted over a $RuCl_3$/NaOCl solution, the hydrous ruthenium oxide thin film deposits selectively on the organic pattern (presumably on alcohol functionalities). The glass may also be silanized with an alcohol-containing silane.

Particular substrates that have been demonstrated with the invention include an oxidized phenolic-based resin (BAKELITE®), and several metals including Cu and In. Particularly valuable substrates for the present invention are perfluorosulfonic ionomer membranes, such as NAFION®. These membranes with deposited hydrous ruthenium oxide can be used in fuel cells for their proton-conducting ability.

Once the substrate has been cleaned and/or functionalized, the oxidizing ruthenium solution is prepared.

The ruthenium-containing compound is mixed with water and an oxidizing agent. The ruthenium containing composition can be $RuCl_3.xH_2O$ and/or $RuO_2.xH_2O$. Preferably, $RuO_2.xH_2O$ is used. Oxidizing agents having a standard potential >1.3 V vs a normal hydrogen electrode (NHE) can be used. Possible oxidizing agents are: NaOCl, $Ca(OCl)_2$, $KMnO_4$, $Ce(SO_4)_2$, $KBrO_3$ $NaIO_4$ and mixtures thereof. Preferably, $Ce(SO_4).2H_2SO_4$ is used.

An exemplary ruthenium-containing vapor-phase species is $RuO_4$ vapor. This vapor can be formed at room temperature and pressure in a number of ways. Yellow $RuO_4$ crystals can be dissolved in water, to form a solution of $RuO_4$. Alternatively, $RuO_4$ vapor also forms over solid $RuO_4$ crystals, i.e., solid $RuO_4$ sublimes under ambient conditions. Under ambient conditions, $RuO_4$ vapors form over $RuO_4$ solid, and over solutions containing $RuO_4$ or related molecules, which may also contain $Ru^{3+}$, $Ru^{4+}$, $Ru^{6+}$, $Ru^{7+}$ and $Ru^{8+}$ ions, or combinations of these ions. Water-soluble ruthenium-containing precursors, e.g., $RuCl_3.xH_2O$, can be converted to these ionic forms in solution via oxidation (e.g., chemical and/or electrochemical oxidation).

Non-water-soluble ruthenium-containing precursors, such as $RuO_2.xH_2O$, are oxidized at their surfaces by oxidizers such as $CeSO_4.2H_2SO_4$ to liberate $Ru^{8+}$ and form $RuO_4$ vapor.

Referring to FIG. 2, the Pourbaix diagram for the $Ru—H_2O$ system shows several solution conditions for use in the present invention, including solutions in which $RuO_4$, $HRuO_5^-$, and $HRuO_4^-$ are formed by adjusting the solution pH and EMF. Skilled practitioners will recognize that these various solutions may be created, as indicated by the Pourbaix diagram, by varying the pH and applied EMF of the system, such as occurs when $Ce(SO_4) \cdot 2H_2SO_4$ is added to $RuO_2 \cdot xH_2O$. Skilled practitioners will also recognize that a unique Pourbaix diagram exists for each operating temperature, and that these (and perhaps other) solutions may be accessed at somewhat different pH and applied EMF than are indicated in FIG. 2 (which is given for the Ru—$H_2O$ system at 25° C.).

Skilled practitioners will recognize that by using standard chemical equilibrium shifting techniques, e.g., changing the concentration or partial pressure of a reactant or product, or by changing the overall system temperature or pressure, or changing the solution pH, the reaction rate and concentration of $RuO_4$ generated may be modulated. For example, with reference to equation (1) below, by increasing or decreasing the partial pressure of oxygen in the system, the reaction can be inhibited or accelerated. A pressure drop imposed near the substrate has been shown to assist the such deposition of $RuO_2 \cdot xH_2O$ films on metals. Other factors affecting the deposition rate (as well as the film thickness, film morphology, hydration, and electrical and catalytic properties) include the activity of the ruthenium in solution, the electrical potential, EMF, of the solution, the partial pressure of the various vapor-phase species, the pH of the solution, substrate temperature, humidity, and the atmospheric temperature and pressure.

The ruthenium-containing compound is mixed with an oxidizing agent and water to generate $RuO_4(g)$ to liberate $Ru^{8+}$. The $RuO_4(g)$ that is generated is reduced on a suitable functional group or surface. The reduction mechanism where R represents a hydrocarbon is as follows:

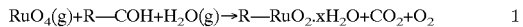

$$RuO_4(g) + R—COH + H_2O(g) \rightarrow R—RuO_2 \cdot xH_2O + CO_2 + O_2 \quad 1$$

A carbonaceous functional group is presumably oxidized to $CO_2$, $O_2$ and $H_2O$. Thus, hydrous ruthenium oxide is selectively deposited onto the surface that contains the $RuO_4$-reactive functional groups.

There is a continuous deposition of the hydrous ruthenium oxide on the previously deposited hydrous ruthenium oxide surface by autocatalysis. This reaction is as follows:

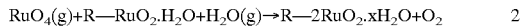

$$RuO_4(g) + R—RuO_2 \cdot H_2O + H_2O(g) \rightarrow R—2RuO_2 \cdot xH_2O + O_2 \quad 2$$

There can be of from about 0.03 to about 3 moles of $H_2O$ per mole of $RuO_2$ in hydrous ruthenium oxide. The amount of water is adjusted by heating the material from 25 to 400° C., see FIG. 4.

Figure 3:
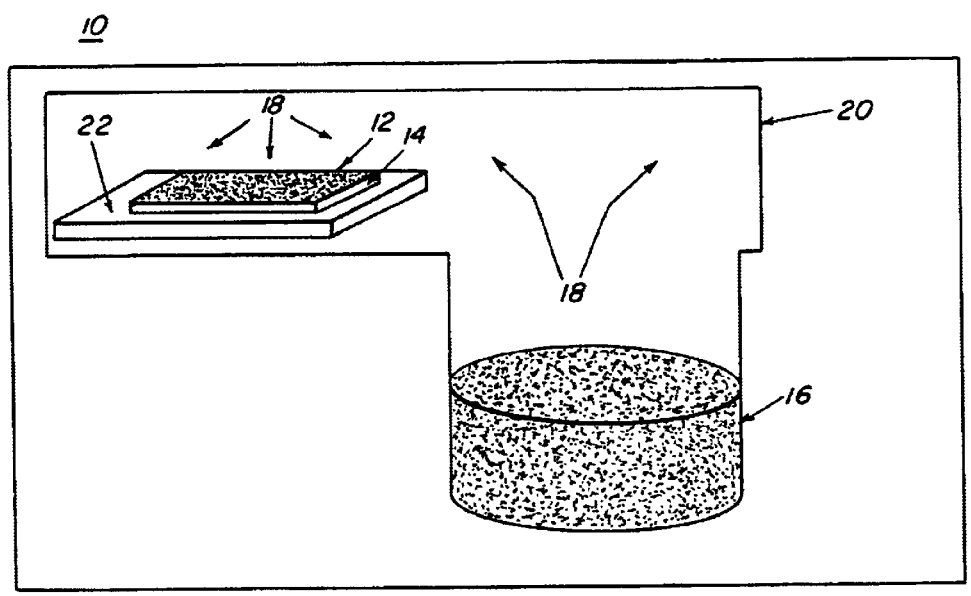
FIG. 3 illustrates schematically an exemplary device for practicing the CVD method of the invention.

As shown in FIG. 3, an exemplary system 10 for depositing a layer of $RuO_2$ 12 on a substrate 14 has a ruthenium-containing solution 16 that produces ruthenium-containing vapor-phase species 18. This ruthenium-containing vapor-phase species 18, which is enclosed in a non-reactive, non-oxidizable chamber 20, is brought into contact with the substrate 14 (typically mounted on a substrate holder 22), where the species deposits as hydrous ruthenium oxide.

An exemplary ruthenium-containing solution is an aqueous solution of 0.01 M $RuCl_3$ at pH 10, with an added oxidizer such as household bleach (active ingredient NaOCl). Oxidizers perform an equivalent function to adjusting the potential, shifting the position on the Pourbaix diagram, FIG. 2. Typically, the oxidizer will be at about 0.01 M concentration, sufficient to modulate the ruthenium-containing vapor-phase species.

The selective deposition process is preferably carried out at ambient temperature or near ambient temperature and pressure. Specifically, at a temperature of from about 25 to about 90° C., and a pressure of from about 0.05 to 5 atm.

Having described the invention, the following examples are given to illustrate specific applications of the invention, including the best mode now known to perform the invention. These specific examples are not intended to limit the scope of the invention described in this

EXAMPLE 1

The reactivity of different chemical functional groups with $RuO_4(g)$ was determined qualitatively by surveying the compounds that demonstrated a color change in the presence of the vapor. The color change indicates the deposition of the hydrous ruthenium oxide. Approximately, 110 mg of a powdered sample having a target functional group was placed on top of a clean glass slide under a glass dome for 30–60 min in the presence of a Ru-oxidizer solution, and observed for the color changes. FIG. 1 indicates functional groups that are highly reactive, some that are partially reactive and others that are non-reactive.

EXAMPLE 2

Functionalization of Substrate

Titanium films (500-Å Ti (100) on Si (100)) were cleaned and etched by sequentially soaking for 5 min in baths of ethanol, acetone, and 5% HF. The substrates were rinsed with $H_2O$ and dried under $N_2$ after each step.

Graphite sheets (0.254-mm thick), carbon paper, and polyphenol (Bakelite®) surfaces were prepared by cleaning in methanol or ethanol, and then oxidized by soaking in 5% $H_2O_2$ for 5 to 10 min and rinsed with water.

Gold films on glass substrates were cleaned with ethanol and water, etched for 5 min in an oxygenated solution of 1.0 M KOH and 0.01 M KCN, rinsed with $H_2O$, and dried with $N_2$.

Polyimide strips were patterned in 100-$\mu$m wide lines on silicon using photolithography and lift-off processes. Polyimide strips and sheets (KAPTAN®) required no surface preparation to react with the $RuO_4(g)$.

Nafion 117 (DuPont) was treated by boiling sequentially for 1 h intervals in 30% $H_2O_2$, 18 M$\Omega$cm water, and 0.5 M $H_2SO_4$. The Nafion membrane was then submerged in a solution of ~0.1 mM p-aminophenol in acetonitrile for 10 min to modify its surface with alcohol functionalities. The phenol-modified Nafion was washed in water, air dried, and then mounted over a 0.5 M $H_2SO_4$ solution containing 5 mM $RuO_2 \cdot 2.1\ H_2O$ and 25 mM $Ce(SO_4)_2$ for 30 min. The $RuO_xH_y$-Nafion films were heated for 1 h at 100° C. in air.

EXAMPLE 3

Preparation of Ru Containing Oxidizing Solution

Ru-oxidizing solution: 15 mg of $RuO_2 \cdot xH_2O$ plus 70 mg of $Ce(SO_4)_2 \cdot 2H_2(SO_4)_2$ were placed in 5 mL of 18 M$\Omega$cm water in a 25 mL plastic beaker.

EXAMPLE 4

Deposition Process

The cleaned and/or surface-modified substrates were mounted on a glass slide that was positioned over the beaker of the fresh Ru-oxidizer solution. This ensemble was tightly covered with a stretched paraffin film (PARAFILM®), and the $RuO_4(g)$ allowed to deposit on the substrate for 10 min to 24 h. The resulting $RuO_2 \cdot xH_2O$ thin films were optionally heated in air in a convection oven to 100–150° C. at 2° C./min, held for 60 min, and cooled at 2° C./min.

EXAMPLE 5

Electrodepositing

For DMFC applications, platinum was electrodeposited on the Nafion-supported $RuO_2 \cdot xH_2O$ thin films from a solution of $H_2Pt(OH)_6$ (~4 mM) in 2 M $H_2SO_4$. A $RuO_2 \cdot H_2O$/Nafion film was suspended in the solution from a copper clip and served as the working electrodes, a Pt-mesh was used as the auxiliary electrode, and a saturated calomel electrode was the reference. A controlled potential of 0.4 V vs NHE was applied using a potentiostat to the $RuO_2 \cdot xH_2O$ films for 15 to 240 s (30 s optimum), and then the films were rinsed in 18 MΩcm water and air dried. The deposition area of the $RuO_xH_y$ ranged between 0.2 and 0.3 $cm^2$. The current applied during Pt deposition was predominantly constant but varied for different samples from 40 and 60 $mAcm^{-2}$.

EXAMPLE 6

Use $RuO_2 \cdot xH_2O$ and Pt—$RuO_2 \cdot xH_2O$ films on Nafion were prepared for testing as ultracapacitors or direct methanol fuel cells by hot pressing them at 100° C. between two sheets of Teflon-impregnated porous carbon paper at 1000 psi for 60 s.

Obviously, many modifications and variations of the present invention are possible in light of the above teachings. It is therefore to be understood that, within the scope of the appended claims, the invention may be practiced otherwise than as specifically described.

What is claimed is:

1. A method for selectively depositing a film of hydrous ruthenium oxide on a substrate, the method comprising the steps of:

selectively functionalizing a substrate surface;

preparing an oxidizing aqueous solution of a Ru-containing composition;

generating $RuO_4(g)$ from said oxidizing solution;

selectively depositing a film of hydrous ruthenium oxide from said vapor of said oxidizing solution on said functionalized surface of said substrate; and depositing by autocatalysis hydrous ruthenium oxide from said vapor of said oxidizing solution on said previously deposited hydrous ruthenium oxide.

2. The selective deposition of claim 1, wherein said substrate is selected from the group consisting of organic compounds and metals, wherein said metal surface is substantially clean and oxide free, wherein said organic compound is selected from the group consisting of graphite, fluoropolymers, hydrocarbons, and carbon paper.

3. The selective deposition method of claim 2, wherein said metal is selected from the group consisting of Ti, Au, Cu and In.

4. The selective deposition method of claim 1, wherein said surface functional group of said substrate is selected from the group consisting of alcohols, thiols, amines/amides, and mixtures thereof.

5. The selective deposition method of claim 1, further including the step of heating said deposited hydrous ruthenium oxide on said substrate thereby adjusting the water composition in said hydrous ruthenium oxide film;

wherein said heated hydrous ruthenium oxide has a formula of $RuO_2 \cdot xH_2O$, and wherein the x is from about 0.03 to about 3 moles.

6. The selective deposition method of claim 1, wherein said depositing step is conducted at ambient temperature or at a temperature of from about 15 to about 90° C., and wherein said depositing step is conducted at ambient pressure or a pressure of from about 0.05 to about 5 atm.

7. The selective deposition method of claim 1, further including the steps of preparing said oxidizing solution by mixing a Ru containing composition, an oxidant and $H_2O$.

8. The selective deposition method of claim 7 where in the Ru-containing composition is selected from the group consisting of $RuCl_3 \cdot xH_2O$ and $RuO_2 \cdot xH_2O$ and wherein said oxidant is selected from the group consisting of NaOCl, $Ca(OCl)_2$, $Ce(SO_4)_2$, $KMnO_4$, $KBrO_3$, $NaIO_4$, and mixtures thereof.

9. The selective deposition method of claim 1, further including the step of applying an inert film around said substrate and said oxidizing solution prior to said selective depositing step.

10. The selective deposition method of claim 1, further comprising the step of electrodepositing metal particles on said hydrous ruthenium oxide layer.

11. A method of selectively depositing a film of hydrous ruthenium oxide on a substrate, the method comprising the steps of:

selectively functionalizing a substrate surface;

preparing an oxidizing aqueous solution of a ruthenium-containing composition, wherein said oxidizing solution contains $RuO_2 \cdot xH_2O$ and hydrous $Ce(SO_4) \cdot 2H_2SO_4$ in water;

generating $RuO_4(g)$ from said oxidizing solution;

selectively depositing a film of hydrous ruthenium oxide from said vapor of said oxidizing solution on said functionalize surface of said substrate; and depositing by autocatalysis hydrous ruthenium oxide from said vapor of said oxidizing solution on said previously deposited hydrous ruthenium oxide.

12. The selective deposition method of claim 11, further comprising the step of: electrodepositing metal particles on said hydrous ruthenium oxide layer.

13. The selective deposition method of claim 11, further including the step of heating said deposited hydrous ruthenium oxide on said substrate thereby adjusting the water composition in said hydrous ruthenium oxide film;

wherein said heated hydrous ruthenium oxide has a formula of $RuO_2 \cdot xH_2O$, and wherein the x is from about 0.03 to about 3 moles.

* * * * *